US010366756B1

(12) United States Patent
Tseng et al.

(10) Patent No.: US 10,366,756 B1
(45) Date of Patent: Jul. 30, 2019

(54) CONTROL CIRCUIT USED FOR TERNARY CONTENT-ADDRESSABLE MEMORY WITH TWO LOGIC UNITS

(71) Applicant: UNITED MICROELECTRONICS CORP., Hsin-Chu (TW)

(72) Inventors: Chun-Yen Tseng, Tainan (TW); Ching-Cheng Lung, Tainan (TW); Yu-Tse Kuo, Tainan (TW); Chun-Hsien Huang, Tainan (TW); Hsin-Chih Yu, Hsinchu County (TW); Shu-Ru Wang, Taichung (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 16/104,946

(22) Filed: Aug. 19, 2018

(30) Foreign Application Priority Data

Jul. 16, 2018 (CN) .......................... 2018 1 0777449

(51) Int. Cl.
G11C 15/00 (2006.01)
G11C 15/04 (2006.01)

(52) U.S. Cl.
CPC .................................... G11C 15/04 (2013.01)

(58) Field of Classification Search
CPC ....... G11C 15/04; G11C 15/046; G11C 15/00; G11C 11/412; G11C 13/0002; G11C 11/1675; G11C 11/404; G11C 15/02; G11C 15/043; G11C 16/0458; G11C 16/0475; G11C 2211/4013
USPC ... 365/49.17, 49.11, 148, 49.1, 49.15, 49.18, 365/50
See application file for complete search history.

(56) References Cited

U.S. PATENT DOCUMENTS 8,958,226 B2   2/2015 Terzioglu
2009/0201709 A1*  8/2009 Inoue .................... G11C 15/04
                                                   365/49.17

OTHER PUBLICATIONS

Nii; DOI: 10.1109/ISSCC.2014.6757417; "13.6 a 28nm 400MHz 4-parallel 1.6Gsearch/s 80Mb ternary CAM"; Published in: 2014 IEEE International Solid-State Circuits Conference Digest of Technical Papers (ISSCC); Publisher: IEEE; Date of Conference: Feb. 9-13, 2014.
Nii; DOI: 10.1109/ICMTS.2015.7106140; "Silicon measurements of characteristics for passgate/pull-down/pull-up MOSs and search MOS in a 28 nm HKMG TCAM bitcell"; Pulisher: IEEE; Published in: Proceedings of the 2015 International Conference on Microelectronic Test Structures; Date of Conference: Mar. 23-26, 2015.

* cited by examiner

Primary Examiner — Thong Q Le
(74) Attorney, Agent, or Firm — Winston Hsu

(57) ABSTRACT

A control circuit for a ternary content-addressable memory includes a first logic unit and a second logic unit. The first logic unit is coupled to a first storage unit, a second storage unit, a first search line, a second search line, a reference voltage terminal, and a match line. The second logic unit is coupled to the first storage unit, the second storage unit, the first search line, the second search line, a first power supply line and a second power supply line. When voltages at the first search line and the second search line match voltages at the first storage unit and the second storage unit, the second logic unit provides a path for electrically connecting the first power supply line to the second power supply line.

13 Claims, 11 Drawing Sheets

US 10,366,756 B1

CONTROL CIRCUIT USED FOR TERNARY CONTENT-ADDRESSABLE MEMORY WITH TWO LOGIC UNITS

BACKGROUND OF THE INVENTION

1. Field of the Invention

The invention related to a control circuit of a ternary content-addressable memory, and more particularly, a control circuit being able to electrically connect two power supply lines when voltages of search lines match voltages of storage units.

2. Description of the Prior Art

A ternary content-addressable memory (TCAM) can support high-speed searching, so it has been widely used for applications of mass searching, such as applications of looking up multiple web addresses (URLs). In a common ternary content addressing memory, each memory unit can be set as one of three states: 1 state, 0 state and don't care state. Since a plurality of memory units can be arranged in an array form, when a large number of lookups are performed, a plurality of memory units can be synchronously compared so as to perform high-speed searching. However, this architecture has technical disadvantages as follows. In a conventional TCAM architecture, a plurality of memory units are all coupled to a match line. In a first time interval (also referred to as a pre-charging interval) of a searching process, the search line is charged to a high voltage. When a voltage of a match line fails to match a setting of any of the memory units, a discharge path is provided to discharge the match line in a second time interval (also referred to as an estimation interval) to reduce the voltage on the match line. It can hence be determined that a mismatch occurs according to a low voltage on the match line. In other words, a mismatch can be determined by observing the change of the voltage on the match line. However, when the number of memory units is large, it is difficult to avoid unintended leakage caused by the increased circuit loading. Hence, it is possible that the settings of all the memory units are all matched, but a voltage of a match line is erroneously reduced to a low level due to leakage, and the result of searching is incorrectly determined to be mismatched. In addition, a node voltage on a match line may also erroneously drop due to undesired charge sharing and cause an incorrect searching result.

In addition to the abovementioned two disadvantages causing incorrect searching results, it is difficult for circuit design to use a TCAM with a conventional structure. Because a match line of a conventional TCAM has to be charged during a pre-charge interval, and the change of a voltage on the match line has to be observed during an estimation interval, the operation of timing is complex, and the difficulty of circuit design is increased.

SUMMARY OF THE INVENTION

An embodiment provides a control circuit for a ternary content-addressable memory comprising a first logic unit and a second logic unit. The first logic unit includes a first terminal coupled to a data access terminal of a first storage unit and configured to access a first storage voltage; a second terminal coupled to a data access terminal of a second storage unit and configured to access a second storage voltage; a third terminal coupled to a first search line; a fourth terminal coupled to a second search line; a fifth terminal coupled to a reference voltage terminal; and a sixth terminal coupled to a match line. The second logic unit includes a first terminal coupled to the data access terminal of the first storage unit; a second terminal coupled to the data access terminal of the second storage unit; a third terminal coupled to the first search line; a fourth terminal coupled to the second search line; a fifth terminal coupled to a first power supply line; and a sixth terminal coupled to a second power supply line. When a first search voltage of the first search line and a second search voltage of the second search line match the first storage voltage and the second storage voltage, the second logic unit provides a path for electrically connecting the first power supply line to the second power supply line.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
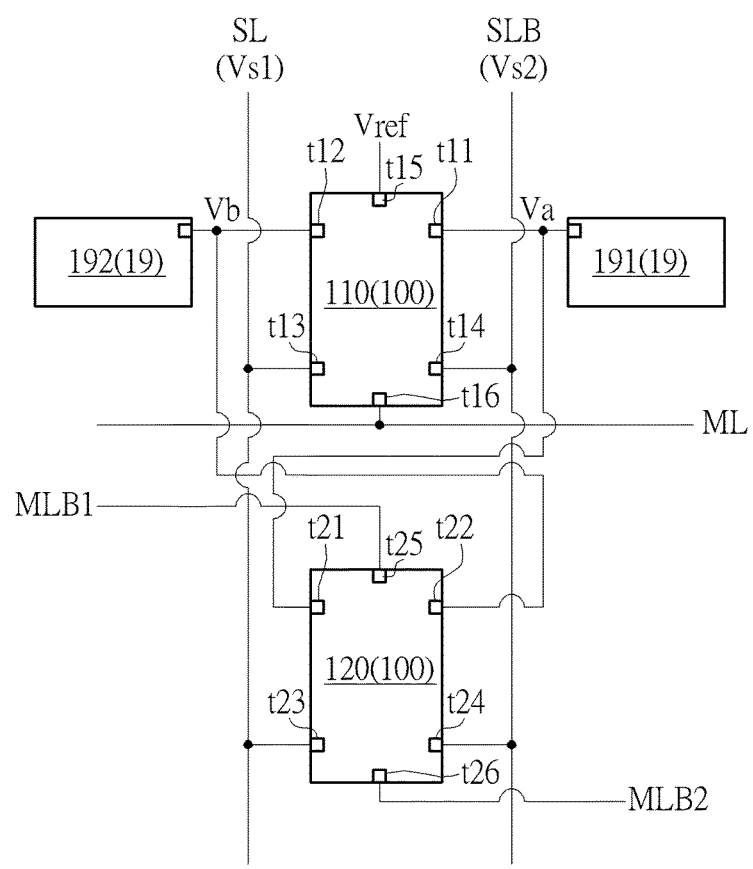
FIG. 1 illustrates an application of a control circuit according to an embodiment.

FIG. 1 illustrates an application of a control circuit 100 according to an embodiment. The control circuit 100 is for controlling a ternary content-addressable memory (TCAM) 19. The TCAM 19 may include a first storage unit 191 and a second storage unit 192. The control circuit 100 may include a first logic unit 110 and a second logic unit 120. The control circuit 100 and the TCAM 19 may be used to form an array unit that may be a portion of a TCAM array described below. The first logic unit 110 may include a first terminal t11 to a sixth terminal t16. The first terminal t11 may be coupled to a data access terminal of the first storage unit 191 and used to access a first storage voltage Va. The second terminal t12 may be coupled to a data access terminal of the second storage unit 192 and used to access a second storage voltage Vb. The third terminal t13 may be coupled to a first search line SL. The fourth terminal t14 may be coupled to a second search line SLB. The fifth terminal t15 may be coupled to a reference voltage terminal Vref. The sixth terminal t16 may be coupled to a match line ML. The second logic unit 120 may include a first terminal t21 to a sixth terminal t26. The first terminal t21 may be coupled to the data access terminal of the first storage unit 191 to access the first storage voltage Va. The second terminal t22 may be coupled to the data access terminal of the second storage unit 192 to access the second storage voltage Vb. The third terminal t23 may be coupled to the first search line SL. The fourth terminal t24 may be coupled to the second search line SLB. The fifth terminal t25 may be coupled to a first power supply line MLB1. The sixth terminal t26 may be coupled to a second power supply line MLB2. When a first search voltage Vs1 of the first search line SL and a second search voltage Vs2 of the second search line SLB match the first storage voltage Va and the second storage voltage Vb, the second logic unit 120 may provide a path for electrically connecting the first power supply line MLB1 to the second power supply line MLB2.

The conditions for the first search voltage Vs1 of the first search line SL and the second search voltage Vs2 of the second search line SLB to match the first storage voltage Va and the second storage voltage Vb may be as described in the following Table 1.

TABLE 1

| The data stored in the TCAM 19 | The first storage voltage Va | The second storage voltage Vb | The first search voltage Vs1 | The second search voltage Vs2 | Match result |
|---|---|---|---|---|---|
| 0 | 0 | 1 | 0 | 0 | mismatch |
|   |   |   | 0 | 1 | match |
|   |   |   | 1 | 0 | mismatch |
|   |   |   | 1 | 1 | mismatch |
| 1 | 1 | 0 | 0 | 0 | mismatch |
|   |   |   | 0 | 1 | mismatch |
|   |   |   | 1 | 0 | match |
|   |   |   | 1 | 1 | mismatch |
| X (don't care) | 0 | 0 | 0 | 0 | match |
|   |   |   | 0 | 1 |   |
|   |   |   | 1 | 0 |   |
|   |   |   | 1 | 1 |   |
| inhibited setting | 1 | 1 | — | — | — |

The description of Table 1 is as follows. When a logic 0 is to be stored in the TCAM 19, the first storage voltage Va may be set as a logic 0 (e.g. a first voltage), and the second storage voltage Vb may be set as a logic 1 (e.g. a second voltage). In this condition, if the first search voltage Vs1 is set as a logic 0 and the second search voltage Vs2 is set as a logic 1, the first search voltage Vs1 and the second search voltage Vs2 may match the first storage voltage Va and the second storage voltage Vb. In addition, if the first search voltage Vs1 and the second search voltage Vs2 are set as other values, the result may be a mismatch. The abovementioned first voltage and second voltage may be different voltages such as a higher voltage and a lower voltage.

When a logic 1 is to be stored in the TCAM 19, the first storage voltage Va may be set as a logic 1, and the second storage voltage Vb may be set as a logic 0. In this condition, if the first search voltage Vs1 is set as a logic 1 and the second search voltage Vs2 is set as a logic 0, the first search voltage Vs1 and the second search voltage Vs2 may match the first storage voltage Va and the second storage voltage Vb. In addition, if the first search voltage Vs1 and the second search voltage Vs2 are set as other values, the result may be a mismatch.

When the TCAM 19 is to enter a "don't care" state, the first storage voltage Va may be set as a logic 0, and the second storage voltage Vb may be set as a logic 0. In this condition, no matter what voltages the first search voltage Vs1 and the second search voltage Vs2 are set, the first search voltage Vs1 and the second search voltage Vs2 may match the first storage voltage Va and the second storage voltage Vb.

According to an embodiment, it is inhibited to set both of the first storage voltage Vs1 and the second storage voltage Vs2 to a logic 1.

The above Table 1 is merely for exemplifying the application and operation of a control circuit rather than limiting the scope of embodiments, and other reasonable modifications and alterations are also within the scope of the embodiment.

Figure 2:
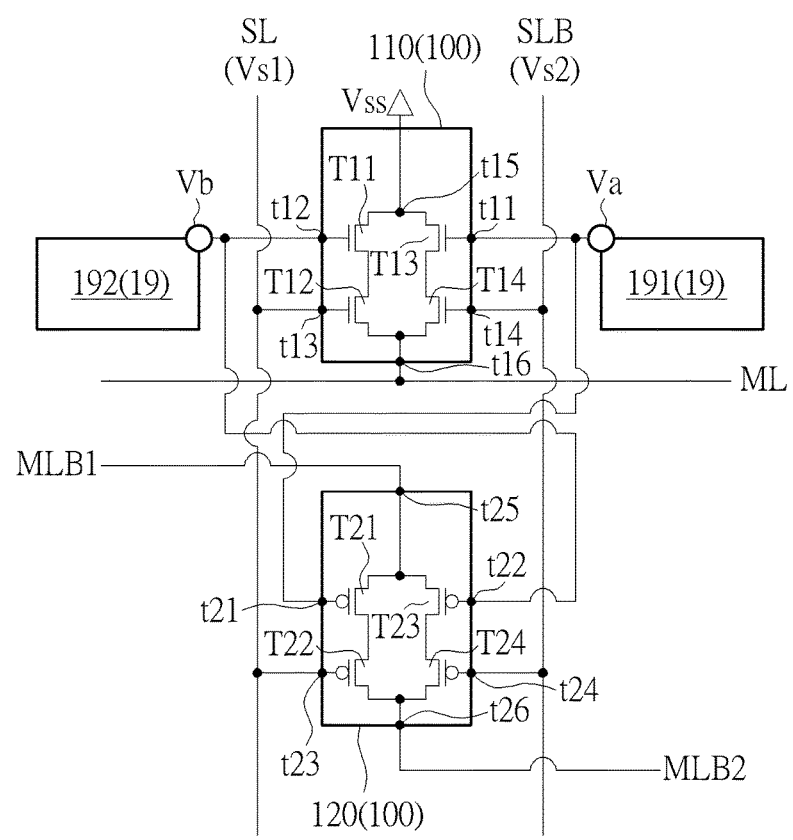
FIG. 2 illustrates an application of the control circuit of FIG. 1 according to an embodiment.

FIG. 2 illustrates an application of the control circuit 100 of FIG. 1 according to an embodiment. In FIG. 2, the control circuit 100 may be an AND-type circuit. As shown in FIG. 2, the first logic unit 110 may include switches T11 to T14, and the second logic unit 120 may include switches T21 to T24.

As shown in FIG. 2, the switch T11 may include a first terminal coupled to the fifth terminal t15 of the first logic unit 110, a second terminal, and a control terminal coupled to one of the second terminal t12 and the third terminal t13 of the first logic unit 110. The switch T12 may include a first terminal coupled to the second terminal of the switch T11, a second terminal coupled to the sixth terminal t16 of the first logic unit 110, and a control terminal coupled to the other one of the second terminal t12 and the third terminal t13 of the first logic unit 110. In other words, the control terminals of the switches T11 and T12 may be respectively coupled to the terminals t12 and t13, or be respectively coupled to the terminals t13 and t12. The switch T13 may include a first terminal coupled to the fifth terminal t15 of the first logic unit 110, a second terminal, and a control terminal coupled to one of the first terminal t11 and the fourth terminal t14 of the first logic unit 110. The switch T14 may include a first terminal coupled to the second terminal of the switch T13, a second terminal coupled to the sixth terminal t16 of the first logic unit 110, and a control terminal coupled to the other one of the first terminal t11 and the fourth terminal t14 of the first logic unit 110. In other words, the control terminals of the switches T13 and T14 may be respectively coupled to the terminals t11 and t14, or be respectively coupled to the terminals t14 and t11.

As shown in FIG. 2, in the second logic unit 120, the switch T21 may include a first terminal coupled to the fifth terminal t25 of the second logic unit 120, a second terminal, and a control terminal coupled to one of the first terminal t21 and the third terminal t23 of the second logic unit 120. The switch T22 may include a first terminal coupled to the second terminal of the switch T21, a second terminal coupled to the sixth terminal t26 of the second logic unit 120, and a control terminal coupled to the other one of the first terminal t21 and the third terminal t23 of the second logic unit 120. In other words, the control terminals of the switches T21 and T22 may be respectively coupled to the terminals t21 and t23, or be respectively coupled to the terminals t23 and t21. The switch T23 may include a first terminal coupled to the fifth terminal t25 of the second logic unit 120, a second terminal, and a control terminal coupled to one of the second terminal t22 and the fourth terminal t24 of the second logic unit 120. The switch T24 may include a first terminal coupled to the second terminal of the switch T23, a second terminal coupled to the sixth terminal t26 of the second logic unit 120, and a control terminal coupled to the other one of the second terminal t22 and the fourth terminal t24 of the second logic unit 120. In other words, the control terminals of the switches T23 and T24 may be respectively coupled to the terminals t22 and t24, or be respectively coupled to the terminals t24 and t22.

As shown in FIG. 2, the switches T11, T12, T13 and T14 may be n-type transistors, and the switches T21, T22, T23 and T24 may be p-type transistors. The reference voltage terminal Vref may provide a low voltage Vss such as a ground voltage.

As shown in FIG. 2, when the first search voltage Vs1 and the second search voltage Vs2 match the first storage voltage Va and the second storage voltage Vb, the switches T21 and T22 of the second logic unit 120 may be turned on concurrently, or the switches T23 and T24 of the second logic unit 120 may be turned on concurrently. A conductive path may hence be provided to electrically connect the first power supply line MLB1 to the second power supply line MLB2.

Figure 3:
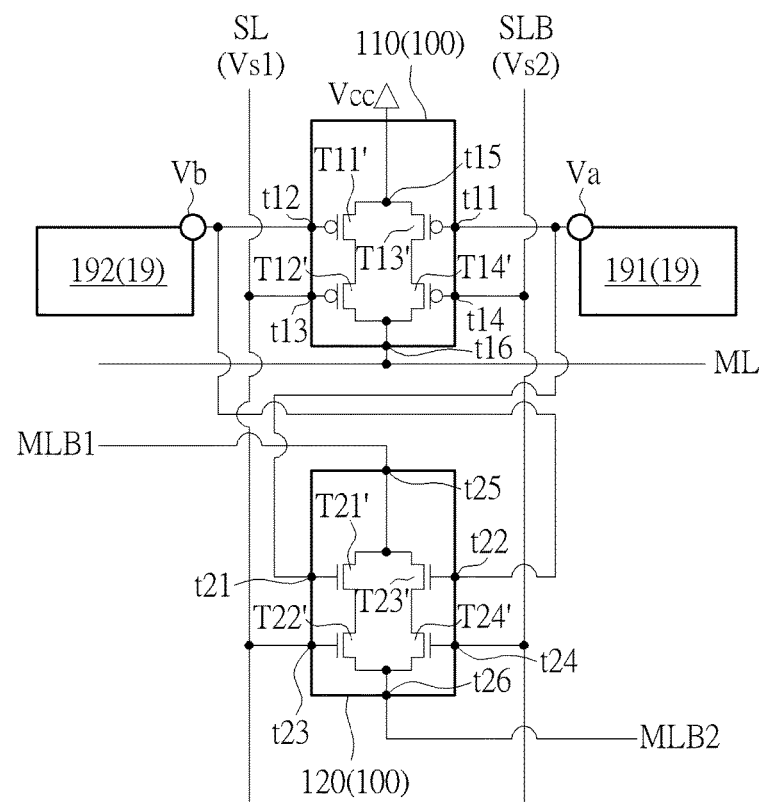
FIG. 3 illustrates an application of the control circuit of FIG. 1 according to another embodiment.

FIG. 3 illustrates an application of the control circuit 100 of FIG. 1 according to another embodiment. In FIG. 3, the control circuit 100 may be an NAND-type circuit. As shown in FIG. 3, the first logic unit 110 may include switches T11' to T14', and the second logic unit 120 may include switches T21' to T24'.

As shown in FIG. 3, the switch T11' may include a first terminal coupled to the fifth terminal t15 of the first logic unit 110, a second terminal, and a control terminal coupled to one of the second terminal t12 and the third terminal t13 of the first logic unit 110. The switch T12' may include a first terminal coupled to the second terminal of the switch T11', a second terminal coupled to the sixth terminal t16 of the first logic unit 110, and a control terminal coupled to the other one of the second terminal t12 and the third terminal t13 of the first logic unit 110. In other words, the control terminals of the switches T11' and T12' may be respectively coupled to the terminals t12 and t13, or be respectively coupled to the terminals t13 and t12. The switch T13' may include a first terminal coupled to the fifth terminal t15 of the first logic unit 110, a second terminal, and a control terminal coupled to one of the first terminal t11 and the fourth terminal t14 of the first logic unit 110. The switch T14' may include a first terminal coupled to the second terminal of the switch T13', a second terminal coupled to the sixth terminal t16 of the first logic unit 110, and a control terminal coupled to the other one of the first terminal t11 and the fourth terminal t14 of the first logic unit 110. In other words, the control terminals of the switches T13' and T14' may be respectively coupled to the terminals t11 and t14, or be respectively coupled to the terminals t14 and t11.

As shown in FIG. 3, in the second logic unit 120, the switch T21' may include a first terminal coupled to the fifth terminal t25 of the second logic unit 120, a second terminal, and a control terminal coupled to one of the first terminal t21 and the third terminal t23 of the second logic unit 120. The switch T22' may include a first terminal coupled to the second terminal of the switch T21', a second terminal coupled to the sixth terminal t26 of the second logic unit 120, and a control terminal coupled to the other one of the first terminal t21 and the third terminal t23 of the second logic unit 120. In other words, the control terminals of the switches T21' and T22' may be respectively coupled to the terminals t21 and t23, or be respectively coupled to the terminals t23 and t21. The switch T23' may include a first terminal coupled to the fifth terminal t25 of the second logic unit 120, a second terminal, and a control terminal coupled to one of the second terminal t22 and the fourth terminal t24 of the second logic unit 120. The switch T24' may include a first terminal coupled to the second terminal of the switch T23', a second terminal coupled to the sixth terminal t26 of the second logic unit 120, and a control terminal coupled to the other one of the second terminal t22 and the fourth terminal t24 of the second logic unit. In other words, the control terminals of the switches T23' and T24' may be respectively coupled to the terminals t22 and t24, or be respectively coupled to the terminals t24 and t22.

As shown in FIG. 3, the switches T11', T12', T13' and T14' may be p-type transistors, and the switches T21', T22', T23' and T24' may be n-type transistors. The reference voltage terminal Vref may provide a high voltage Vcc such as a voltage from a power supply.

As shown in FIG. 3, when the first search voltage Vs1 and the second search voltage Vs2 match the first storage voltage Va and the second storage voltage Vb, the switches T21' and T22' of the second logic unit 120 may be turned on concurrently, or the switches T23' and T24' of the second logic unit 120 may be turned on concurrently. A conductive path may hence be provided to electrically connect the first power supply line MLB1 to the second power supply line MLB2.

Figure 4:
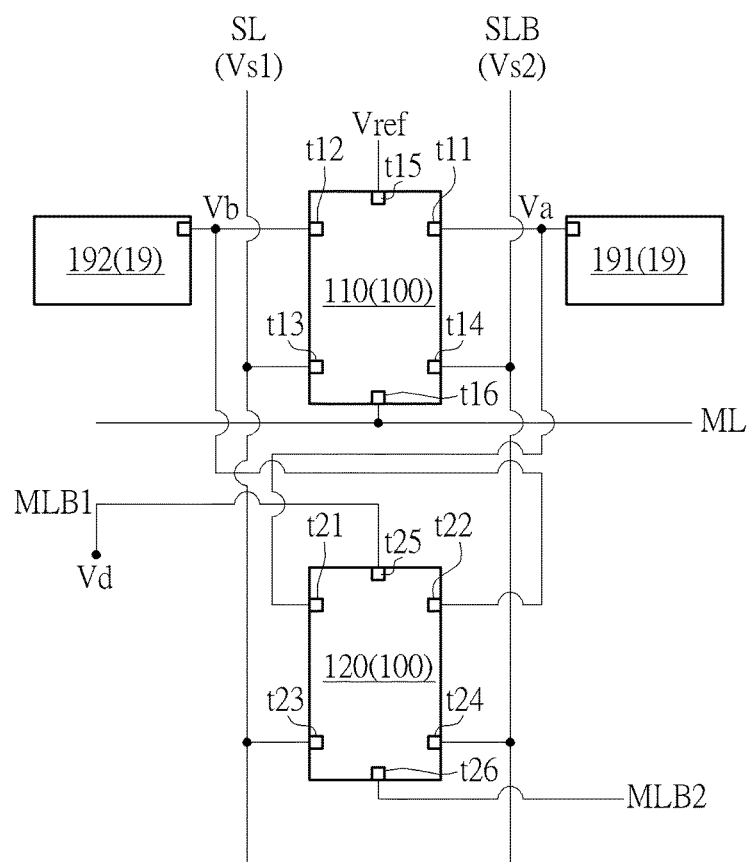
FIG. 4 illustrates a control circuit of FIG. 1 being arranged in a first stage of an array.

According to embodiments, a plurality of control circuit 100 may be used to respectively control a plurality of memory units, and be arranged as an array. FIG. 4 illustrates a control circuit 100 of FIG. 1 being arranged in a first stage of an array. The first stage described here may be the very first stage in an array, so it may be a 0th stage if the stages are numbered from zero. As shown in FIG. 4, the first power supply line MLB1 or the second power supply line MLB2 may be used to receive an enable voltage Vd. The enable voltage Vd may be the abovementioned high voltage Vcc. According to an embodiment of FIG. 4, the first power supply line MLB1 may receive the enable voltage Vd, and the second power supply line MLB2 may be coupled to a next stage. According to another embodiment, the second power supply line MLB2 may receive the enable voltage Vd, and the first power supply line MLB1 may be coupled to a next stage.

Figure 5:
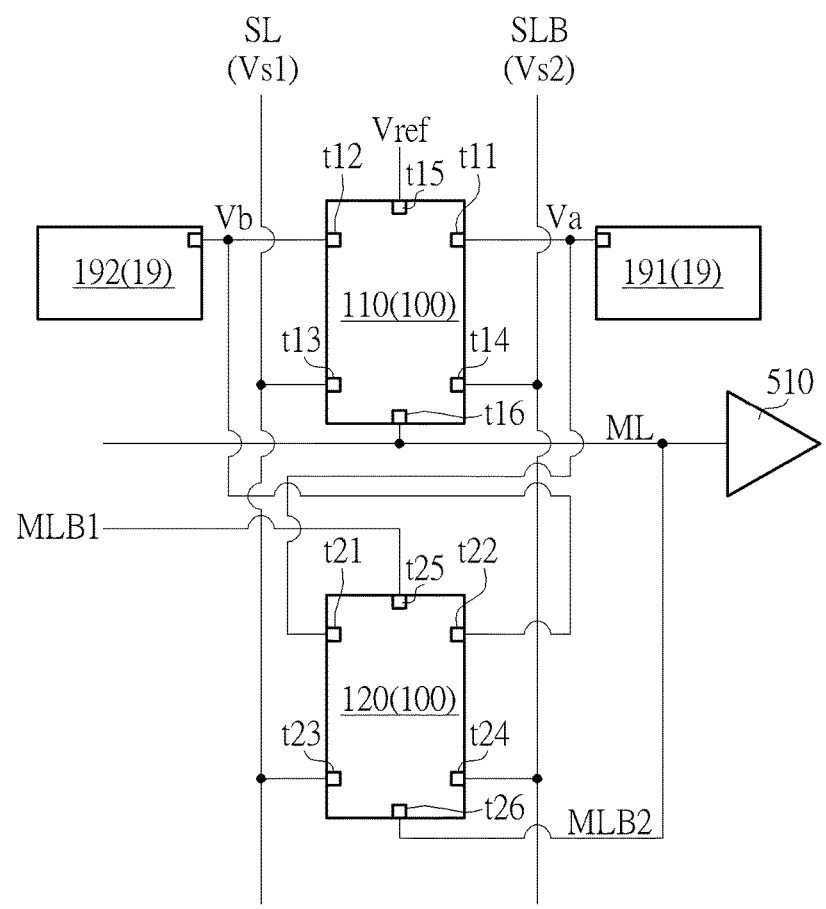
FIG. 5 illustrates a control circuit of FIG. 1 being arranged in a last stage of an array.
Figure 6:
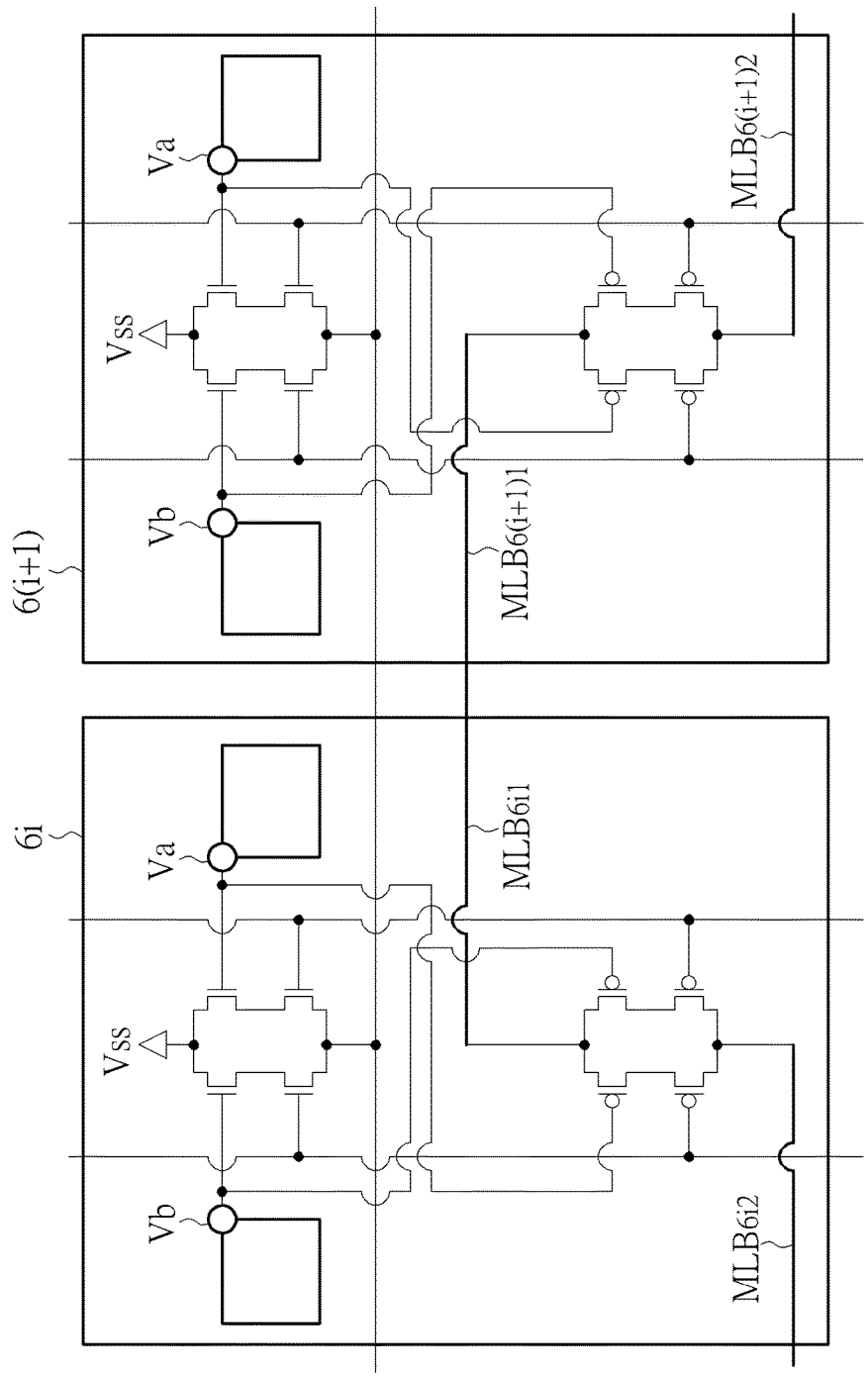
FIG. 6 to FIG. 9 illustrate two array units of two successive stages being coupled to one another in a TCAM array according to embodiments.
Figure 7:
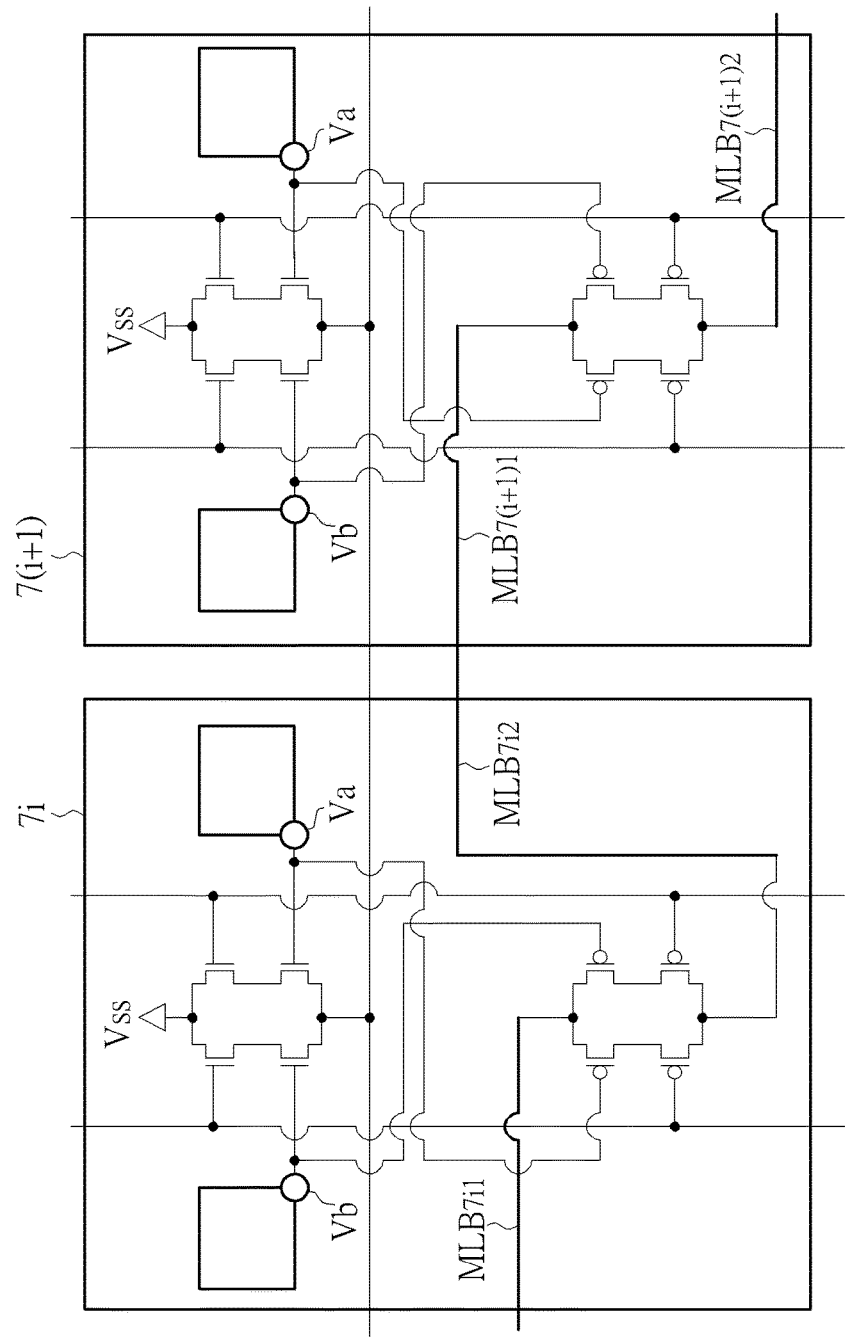
Figure 8:
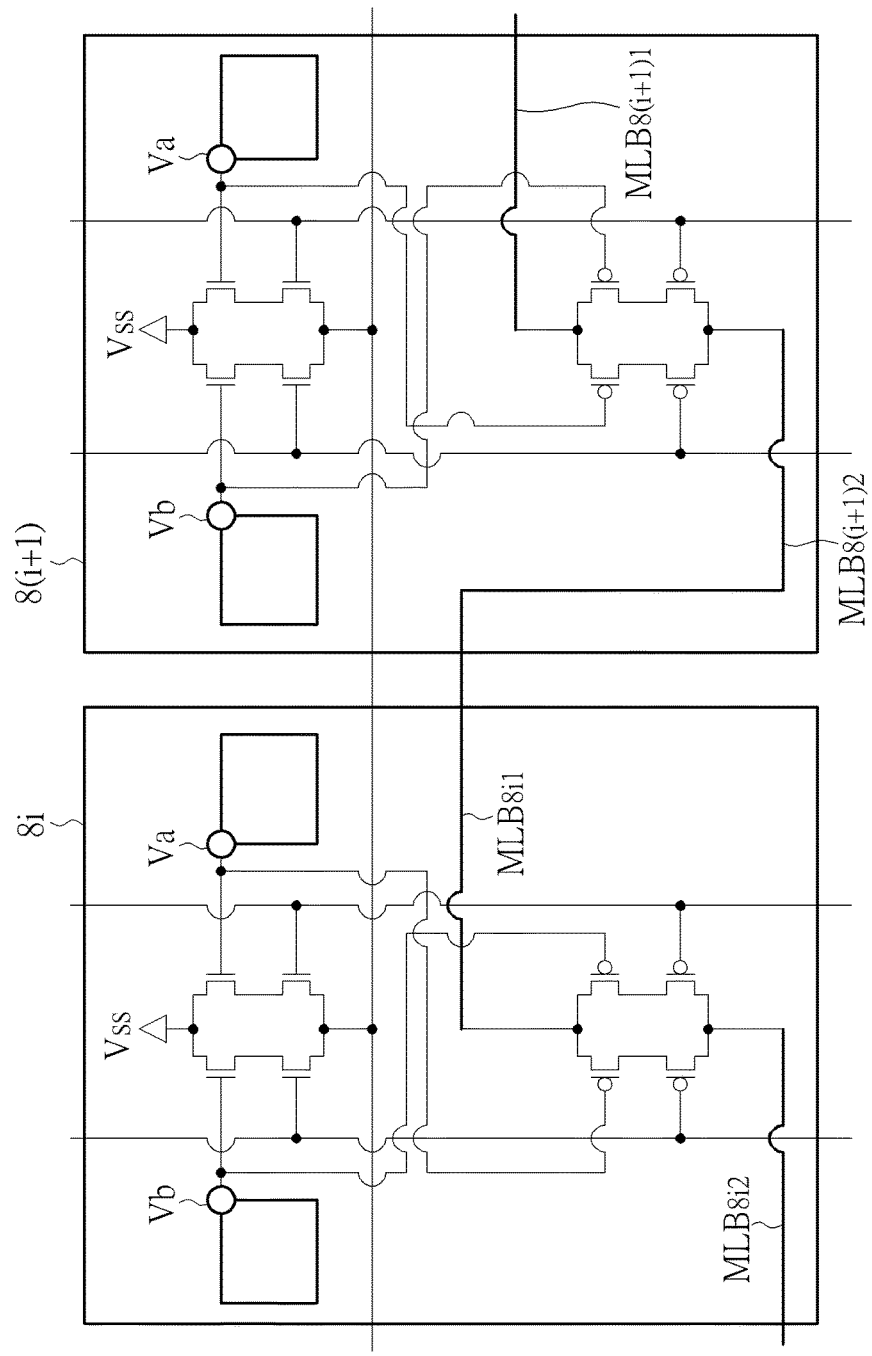
Figure 9:
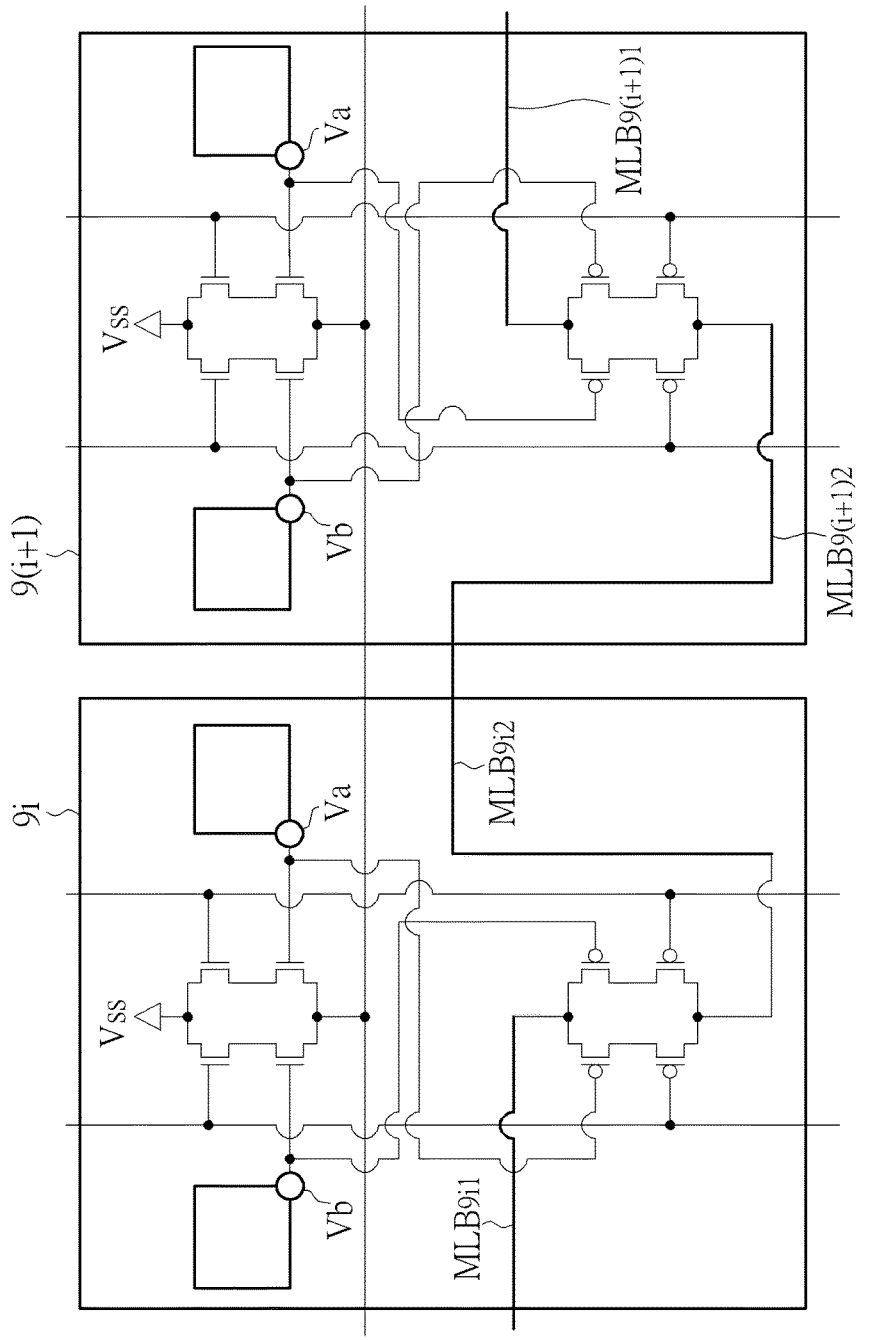

FIG. 5 illustrates a control circuit 100 of FIG. 1 being arranged in a last stage of an array. According to embodiments, when a control circuit 100 of FIG. 1 is arranged in a last stage of an array, a first power supply line MLB1 or a second power supply line MLB2 may be coupled to a match line ML. As shown in FIG. 5, when the first power supply line MLB1 is coupled to a previous stage, the second power supply line MLB2 may be coupled to the match line ML. According to another embodiment, when the second power supply line MLB2 is coupled to a previous stage, the first power supply line MLB1 may be coupled to the match line ML. As shown in FIG. 5, a sense amplifier 510 may be coupled to a control circuit 100 of a last stage to amplify a voltage on the match line ML. When the voltage on the match line ML is excessively low, it may be determined that a result of search is a mismatch.

Figure 10:
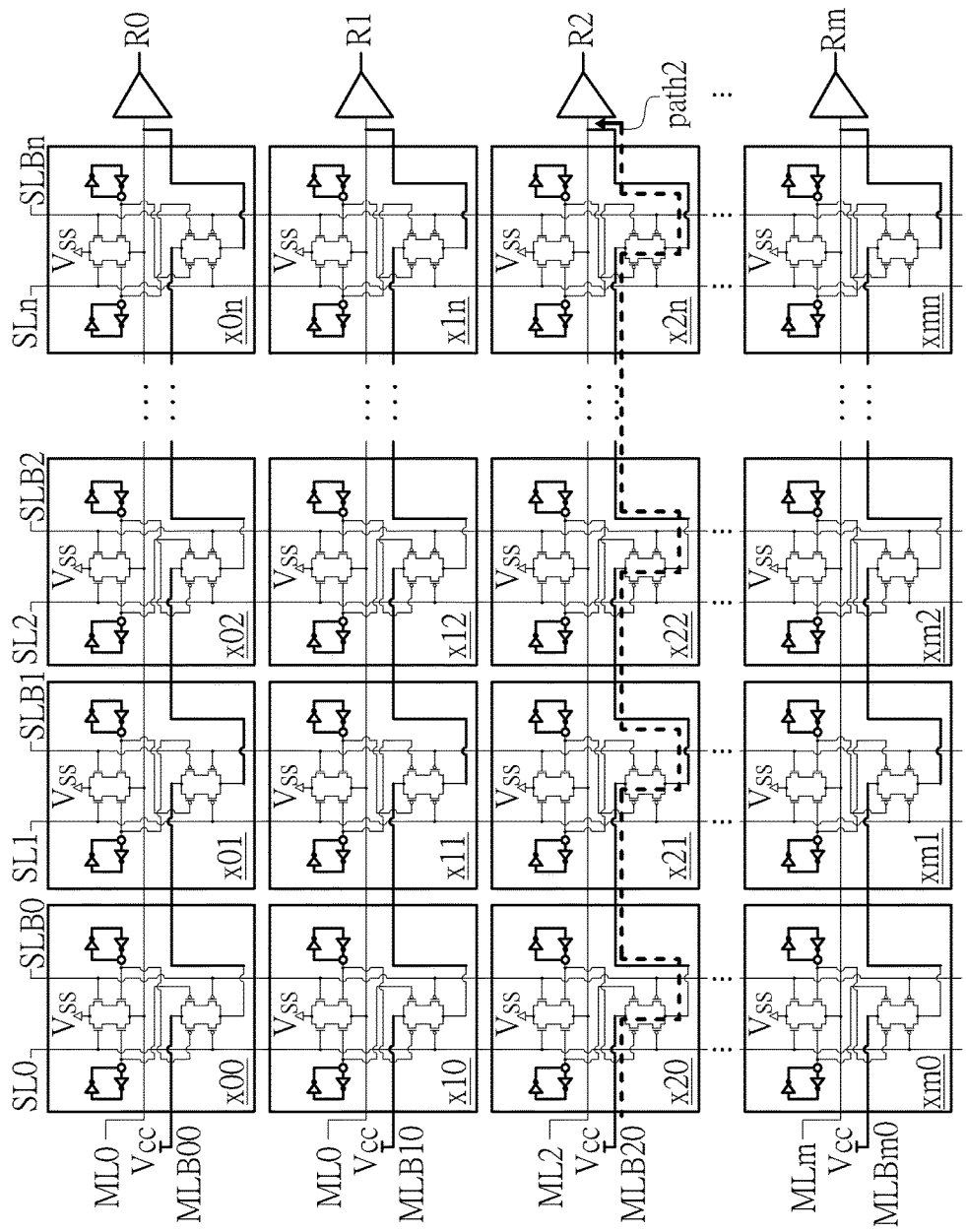
FIG. 10 illustrates a TCAM array using circuit structures of FIG. 1, FIG. 4, FIG. 5 and FIG. 7 according to an embodiment.

FIG. 6 to FIG. 9 illustrate two array units of two successive stages being coupled to one another in a TCAM array according to embodiments. In examples shown in FIG. 6 to FIG. 9, the circuit of FIG. 2 is used. According to an example of FIG. 6, a second power supply line $MLB_{6i2}$ of an array unit $6i$ of an $i_{th}$ stage may be coupled to a previous stage, a first power supply line $MLB_{6i1}$ may be coupled to a first power supply line $MLB_{6(i+1)1}$ of an array unit $6(i+1)$ of an $(i+1)_{th}$ stage, and a second power supply line $MLB_{6(i+1)2}$ of the array unit $6(i+1)$ may be coupled to a next stage. According to an example of FIG. 7, a first power supply line $MLB_{7i1}$ of an array unit $7i$ of an $i_{th}$ stage may be coupled to a previous stage, a second power supply line $MLB_{7i2}$ may be coupled to a first power supply line $MLB_{7(i+1)1}$ of an array unit $7(i+1)$ of an $(i+1)_{th}$ stage, and a second power supply line $MLB_{7(i+1)2}$ of the array unit $7(i+1)$ may be coupled to a next stage. According to an example of FIG. 8, a second power supply line $MLB_{8i2}$ of an array unit $8i$ of an $i_{th}$ stage may be coupled to a previous stage, a first power supply line $MLB_{8i1}$ may be coupled to a second power supply line $MLB_{8(i+1)2}$ of an array unit $8(i+1)$ of an $(i+1)_{th}$ stage, and a first power supply line $MLB_{8(i+1)1}$ of the array unit $8(i+1)$ may be coupled to a next stage. According to an example of FIG. 9, a first power supply line $MLB_{9i1}$ of an array unit $9i$ of an $i_{th}$ stage may be coupled to a previous stage, a second power supply line $MLB_{9i2}$ may be coupled to a second power supply line $MLB_{9(i+1)2}$ of an array unit $9(i+1)$ of an $(i+1)_{th}$ stage, and a first power supply line $MLB_{9(i+1)1}$ of the array unit $9(i+1)$ may be coupled to a next stage. In FIG. 6 to FIG. 9, the $i_{th}$ stage is a previous stage of the $(i+1)_{th}$ stage. In other words, a first power supply line or a second power supply line of an array unit may form a controllable conductive path with a first power supply line or a second power supply line of an array unit of a next stage. Hence, when searching results of two array units of two successive stages are both matches, an enable voltage may be accessed through a conductive path. In FIG. 10, related application is further described.

FIG. 10 illustrates a TCAM array using circuit structures of FIG. 1, FIG. 4, FIG. 5 and FIG. 7 according to an embodiment. As shown in FIG. 10, each array unit may include a first logic unit, a second logic unit, a first storage unit and a second storage unit. In FIG. 10, the circuit structure of FIG. 2 is used, and this is merely an example instead of limiting the scope of embodiments. In FIG. 10, each of the first storage units and the second storage units is formed with two inverters to show a function of a storage unit. In FIG. 10, the TCAM array includes (m+1) horizontal rows and (n+1) vertical columns. An array unit on an $i_{th}$ row and a $j_{th}$ column may be an array unit xij. The mentioned variables i, j, m, n are positive integers larger than zero, 0≤i≤m, 0≤j≤n. The array units x00 to xm0 at the leftmost side may correspond to the circuit of the very first stage shown in FIG. 4. In other words, in the array units x00 to xm0, a first power supply line or a second power supply line of each array unit (e.g. x10) may receive an enable voltage. In FIG. 10, the enable voltage is a high voltage Vcc as an example. In FIG. 10, the array units x0n to xmn at the rightmost side may correspond to the circuit of the last stage shown in FIG. 5. In other words, in the array units x0n to xmn, a first power supply line or a second power supply line of each array unit (e.g. x1n) may be coupled to a corresponding match line of match lines ML0 to MLm. In FIG. 10, two adjacent array units are coupled to each other in a manner of FIG. 7, however, this is merely an example, and it is also allowed to connect two adjacent array units in a manner of FIG. 6, FIG. 8 or FIG. 9.

The array units x20 to x2n on the third row in FIG. 10 may be used to describe a searching (lookup) operation. If in each of the array units x20 to x2n, a first search voltage and a second search voltage match a first storage voltage and a second storage voltage, each of the array units x20 to x2n may provide a conductive path. Hence, a conductive path path2 may be formed, and an enable voltage (e.g. the high voltage Vcc) may be used to charge the match line ML2. By charging a match line when search results are matches, a voltage on a match line may be kept from being incorrectly reduced by excessive loading or undesired sharing effect. Moreover, according to embodiments, it may be no longer necessary to charge a match line in a pre-charge interval, simplifying the design of timing sequence. In FIG. 10, the match lines used to receive the enable voltage of the zeroth stage of the rows may be MLB00, MLB10, MLB20 to MLBm0 as illustrated.

According to embodiments, a TCAM array may be searched synchronously. For example, as shown in FIG. 10, a first search line SL0 and a second search line SLB0 may be used to synchronously search data stored in the array units x00 to xm0. A first search line SL1 and a second search line SLB1 may be used to synchronously search data stored in the array units x01 to xm1. Similarly, a first search line SLn and a second search line SLBn may be used to synchronously search data stored in the array units x0n to xmn. Hence, result signals R1 to Rm may be substantially obtained at the same time, and each of the signals R1 to Rn may be used to determine whether searches of a corresponding row are all matched. A result signal Ri may be of an enable voltage only when searches of all array units on an $i_{th}$ row are all matched.

Figure 11:
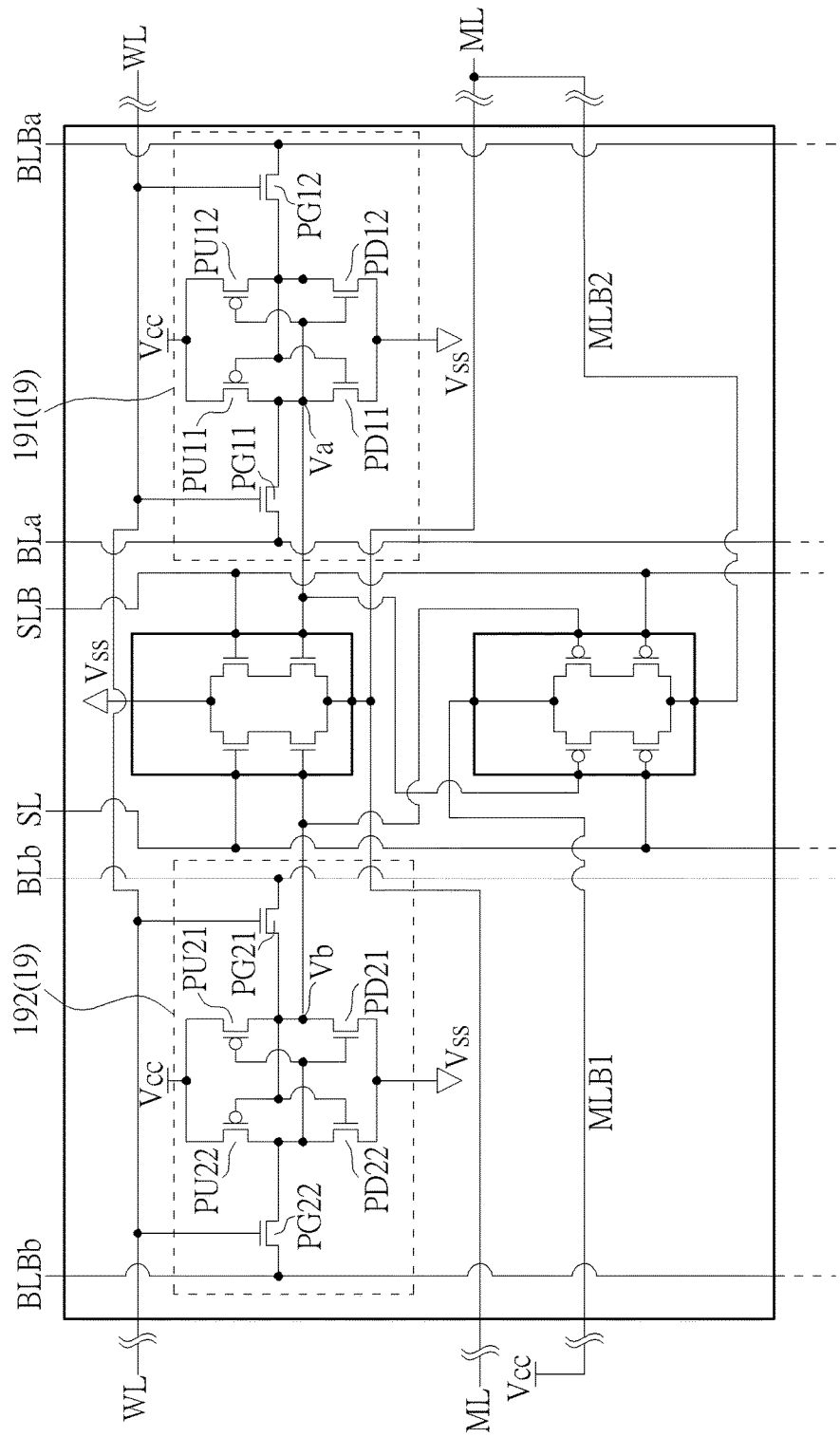
FIG. 11 illustrates the first storage unit and the second storage unit of FIG. 1 being static random-access memory (SRAM) cells.

FIG. 11 illustrates the first storage unit 191 and the second storage unit 192 of FIG. 1 being static random-access memory (SRAM) cells. In FIG. 11, the first logic unit 110 and the second logic unit 120 are as shown in FIG. 2 as an example. Each of the first storage unit 191 and the second storage unit 192 in FIG. 11 may be an SRAM cell including six transistors. In the first storage unit 191 of FIG. 11, transistors PU11 and PU12 are pull-up transistors, transistors PD11 and PD12 are pull-down transistors, control terminals of transistors PG11 and PG12 may be coupled to a word line WL, and the transistors PG11 and PG12 may be respectively coupled to bit lines BLa and BLBa. A node coupled to the transistors PG11, PD11 and PU11 may store the first storage voltage Va. In the second storage unit 192 of FIG. 11, transistors PU21 and PU22 are pull-up transistors, transistors PD21 and PD22 are pull-down transistors, control terminals of transistors PG21 and PG22 may be coupled to the word line WL, and the transistors PG21 and PG22 may respectively be coupled to bit lines BLb and BLBb. A node coupled to the transistors PG21, PD21 and PU21 may store the first storage voltage Vb.

The circuit of FIG. 11 is merely an example, and the first storage unit 191 and the second storage unit 192 are not limited to SRAM cells. According to embodiments, the first storage unit 191 and the second storage unit 192 may be dynamic random-access memory (DRAM) cells, flash memory cells or other kinds of memory cells supporting operation of TCAM.

In summary, by means of a control circuit of a TCAM which is configured and operated according to an embodiment, it may be prevented that a voltage on a match line is incorrectly reduced because of excessive loading or charge sharing, and an incorrect matching result may hence be prevented. In addition, it may be unnecessary to charge a match line during a pre-charge interval, so the design of timing sequence may be simplified, and complexity and difficulty of circuit design may be lowered. It is beneficial for alleviating technical problems in the field.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A control circuit for a ternary content-addressable memory comprising:
   a first logic unit comprising:

a first terminal coupled to a data access terminal of a first storage unit and configured to access a first storage voltage;

a second terminal coupled to a data access terminal of a second storage unit and configured to access a second storage voltage;

a third terminal coupled to a first search line;

a fourth terminal coupled to a second search line;

a fifth terminal coupled to a reference voltage terminal; and a sixth terminal coupled to a match line; and a second logic unit comprising:

a first terminal coupled to the data access terminal of the first storage unit;

a second terminal coupled to the data access terminal of the second storage unit;

a third terminal coupled to the first search line;

a fourth terminal coupled to the second search line;

a fifth terminal coupled to a first power supply line; and a sixth terminal coupled to a second power supply line;

wherein when a first search voltage of the first search line and a second search voltage of the second search line match the first storage voltage and the second storage voltage, the second logic unit provides a path for electrically connecting the first power supply line to the second power supply line.

2. The control circuit of claim 1, wherein when the first search voltage is substantially equal to the first storage voltage, and the second search voltage is substantially equal to the second storage voltage, the first search voltage and the second search voltage match the first storage voltage and the second storage voltage.

3. The control circuit of claim 1, wherein when the first search voltage and the second search voltage are corresponding to a don't care state, the first search voltage and the second search voltage match the first storage voltage and the second storage voltage.

4. The control circuit of claim 1, wherein the second logic unit further comprises:

a first switch comprising a first terminal coupled to the fifth terminal of the second logic unit, a second terminal, and a control terminal coupled to one of the first terminal and the third terminal of the second logic unit;

a second switch comprising a first terminal coupled to the second terminal of the first switch, a second terminal coupled to the sixth terminal of the second logic unit, and a control terminal coupled to another one of the first terminal and the third terminal of the second logic unit;

a third switch comprising a first terminal coupled to the fifth terminal of the second logic unit, a second terminal, and a control terminal coupled to one of the second terminal and the fourth terminal of the second logic unit; and a fourth switch comprising a first terminal coupled to the second terminal of the third switch, a second terminal coupled to the sixth terminal of the second logic unit, and a control terminal coupled to another one of the second terminal and the fourth terminal of the second logic unit.

5. The control circuit of claim 4, wherein the first logic unit further comprises:

a fifth switch comprising a first terminal coupled to the fifth terminal of the first logic unit, a second terminal, and a control terminal coupled to one of the second terminal and the third terminal of the first logic unit;

a sixth switch comprising a first terminal coupled to the second terminal of the fifth switch, a second terminal coupled to the sixth terminal of the first logic unit, and a control terminal coupled to another one of the second terminal and the third terminal of the first logic unit;

a seventh switch comprising a first terminal coupled to the fifth terminal of the first logic unit, a second terminal, and a control terminal coupled to one of the first terminal and the fourth terminal of the first logic unit; and an eighth switch comprising a first terminal coupled to the second terminal of the seventh switch, a second terminal coupled to the sixth terminal of the first logic unit, and a control terminal coupled to another one of the first terminal and the fourth terminal of the first logic unit.

6. The control circuit of claim 5, wherein the first switch, the second switch, the third switch and the fourth switch are p-type transistors.

7. The control circuit of claim 6, wherein the fifth switch, the sixth switch, the seventh switch and the eighth switch are n-type transistors.

8. The control circuit of claim 5, wherein the first switch, the second switch, the third switch and the fourth switch are n-type transistors.

9. The control circuit of claim 8, wherein the fifth switch, the sixth switch, the seventh switch and the eighth switch are p-type transistors.

10. The control circuit of claim 1, wherein the first power supply line is coupled to the match line.

11. The control circuit of claim 1, wherein the second power supply line is coupled to the match line.

12. The control circuit of claim 1, wherein the first power supply line is configured to receive an enable voltage.

13. The control circuit of claim 1, wherein the second power supply line is configured to receive an enable voltage.

* * * * *